(12) United States Patent
Fitzergald

(10) Patent No.: US 6,677,655 B2
(45) Date of Patent: Jan. 13, 2004

(54) SILICON WAFER WITH EMBEDDED OPTOELECTRONIC MATERIAL FOR MONOLITHIC OEIC

(75) Inventor: Eugene A. Fitzergald, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 109 days.

(21) Appl. No.: 09/920,075

(22) Filed: Aug. 1, 2001

(65) Prior Publication Data
US 2002/0040983 A1 Apr. 11, 2002

Related U.S. Application Data
(60) Provisional application No. 60/223,407, filed on Aug. 4, 2000.

(51) Int. Cl.[7] .......................................... H01L 31/0232
(52) U.S. Cl. ..................... 257/432; 257/186; 257/188; 257/432; 257/436; 257/465; 257/616; 372/45; 372/96; 438/45; 438/47; 438/91
(58) Field of Search ................. 257/186, 188, 257/432, 436, 465, 616; 372/45, 96; 438/45, 47, 91

(56) References Cited

U.S. PATENT DOCUMENTS

| | | | |
|---|---|---|---|
| 4,370,510 A | 1/1983 | Stirn ........................ 136/262 |
| 4,774,205 A | 9/1988 | Choi et al. .................... 437/59 |
| 4,888,302 A | 12/1989 | Ramesh ....................... 437/82 |
| 4,897,367 A | 1/1990 | Ogasawara ................. 437/132 |
| 4,959,694 A | 9/1990 | Gell ............................. 357/16 |
| 5,013,681 A | 5/1991 | Godbey et al. ............... 437/86 |
| 5,068,695 A | 11/1991 | Mooney et al. ............... 357/16 |
| 5,102,812 A | 4/1992 | Caneau et al. ................ 437/32 |
| 5,207,864 A | 5/1993 | Bhat et al. .................. 156/633 |
| 5,221,413 A | 6/1993 | Brasen et al. ............... 156/613 |
| 5,314,107 A | 5/1994 | d'Aragona et al. ......... 228/116 |
| 5,346,848 A | 9/1994 | Grupen-Shemansky et al. .......... 437/61 |
| 5,401,983 A | 3/1995 | Jokerst et al. ................ 257/82 |
| 5,461,243 A | 10/1995 | Ek et al. ..................... 257/190 |
| 5,472,907 A | 12/1995 | Binsma et al. ............. 437/129 |
| 5,528,054 A | 6/1996 | Ipposhi et al. ................ 257/66 |

(List continued on next page.)

FOREIGN PATENT DOCUMENTS

| | | |
|---|---|---|
| GB | 2335792 | 9/1999 |
| JP | 02306680 | 12/1990 |
| WO | WO 98/59365 | 12/1998 |

OTHER PUBLICATIONS

Nakahara et al., "High–Sensitivity 1 Gbit/s CMOS Receiver Integrated with GaAs–or InGaAs–Photodiode by Wafer–Bonding," *Electronics Letters*, vol. 37, No. 12, Jun. 7, 2001, pp. 781–783.

(List continued on next page.)

*Primary Examiner*—David Nelms
*Assistant Examiner*—Mai-Huong Tran
(74) *Attorney, Agent, or Firm*—Testa, Hurwitz & Thibeault, LLP

(57) ABSTRACT

A structure with an optically active layer embedded in a Si wafer, such that the outermost epitaxial layer exposed to the CMOS processing equipment is always Si or another CMOS-compatible material such as $SiO_2$. Since the optoelectronic layer is completely surrounded by Si, the wafer is fully compatible with standard Si CMOS manufacturing. For wavelengths of light longer than the bandgap of Si (1.1 $\mu m$), Si is completely transparent and therefore optical signals can be transmitted between the embedded optoelectronic layer and an external waveguide using either normal incidence (through the Si substrate or top Si cap layer) or in-plane incidence (edge coupling).

58 Claims, 7 Drawing Sheets

U.S. PATENT DOCUMENTS

| | | | | |
|---|---|---|---|---|
| 5,534,713 | A | | 7/1996 | Ismail et al. .................. 257/24 |
| 5,726,462 | A | | 3/1998 | Spahn et al. .................. 257/76 |
| 5,780,875 | A | | 7/1998 | Tsuji et al. .................... 257/81 |
| 5,783,839 | A | | 7/1998 | Morikawa et al. ............ 257/21 |
| 5,805,755 | A | | 9/1998 | Amersfoort et al. ......... 385/131 |
| 5,906,951 | A | | 5/1999 | Chu et al. .................... 438/751 |
| 5,937,274 | A | * | 8/1999 | Kondow et al. ............ 257/186 |
| 5,966,622 | A | | 10/1999 | Levine et al. ................ 438/459 |
| 6,059,895 | A | | 5/2000 | Chu et al. ................... 148/33.1 |
| 6,066,513 | A | | 5/2000 | Pogge et al. ................ 438/113 |
| 6,107,653 | A | | 8/2000 | Fitzgerald ................... 257/191 |
| 6,136,667 | A | | 10/2000 | Hui et al. .................... 438/459 |
| 6,151,347 | A | * | 11/2000 | Noel et al. .................... 372/45 |
| 6,191,006 | B1 | | 2/2001 | Mori .......................... 438/455 |
| 6,225,192 | B1 | | 5/2001 | Aspar et al. ................. 438/460 |
| 6,232,138 | B1 | | 5/2001 | Fitzgerald et al. ............. 438/46 |
| 6,291,321 | B1 | | 9/2001 | Fitzgerald ................... 438/494 |
| 6,307,242 | B1 | * | 10/2001 | Sugiyama ................... 257/188 |
| 6,323,108 | B1 | | 11/2001 | Kub et al. ................... 438/458 |
| 6,346,453 | B1 | | 2/2002 | Kovacic et al. ............. 438/312 |
| 6,392,257 | B1 | | 5/2002 | Ramdani et al. ............ 257/190 |

OTHER PUBLICATIONS

Corbett et al., "Low–Stress Hybridisation of Emitters, Detectors and Driver Circuitry on a Silicon Motherboard for Optoelectronic Interconnect Architecture," *Materials Science in Semiconductor Processing*, vol. 3, No. 5–6, 2000, pp. 449–453.

London et al., "Preparation of Silicon–on–Gallium Arsenide Wafers for Monolithic Optoelectronic Integration," *IEEE Photonics Technology Letters*, vol. 11, No. 8, Aug. 1999, pp. 958–960.

Fathollahnejad et al., "The integration of GaAs vertical–cavity surface emitting lasers onto silicon circuitry," IEEE/Cornell Conference on Advanced Concepts in Ithaca, NY (1995) pp. 373–381.

Wada et al., "Room–Temperature Photo–Pumped Operation of 1.58–$\mu$m Vertical–Cavity Lasers Fabricated in Si Substrates Using Wafer Bonding," *IEEE Photonics Technology Letters*, vol. 8, No. 11 (Nov. 11, 1996) pp. 1426–1428.

Matsuo et al., "Use of polyimide bonding for hybrid integration of a vertical cavity surface emitting laser on a silicon substrate," *Electronic Letters*, vol. 33, No. 13 (Jun. 19, 1997) pp. 1148–1149.

Preliminary Examination Report for International Patent Application No. PCT/US01/24075, 2 pages.

International Search Report for International Patent Application No. PCT/US01/24075, 4 pages.

* cited by examiner

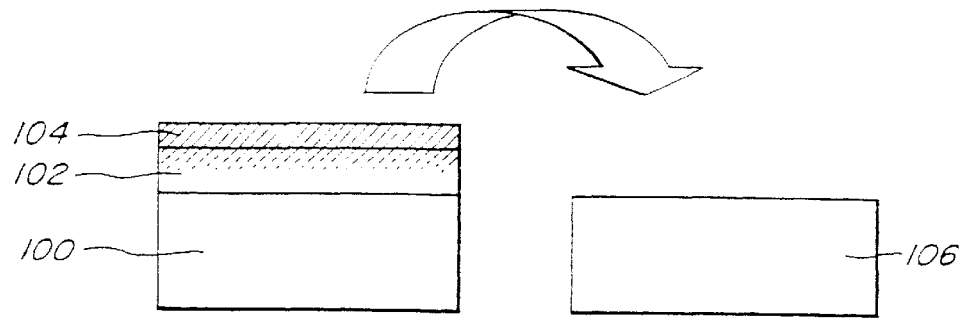
FIG. 1A
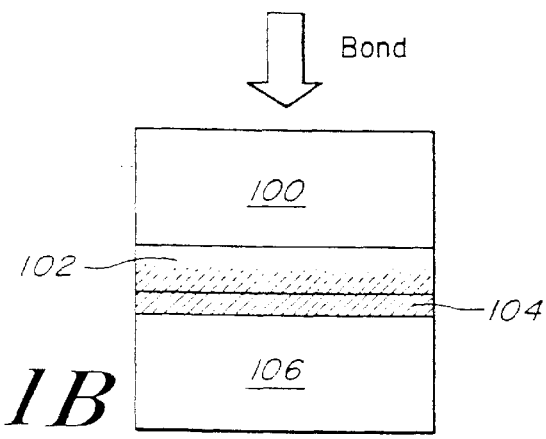
FIG. 1B
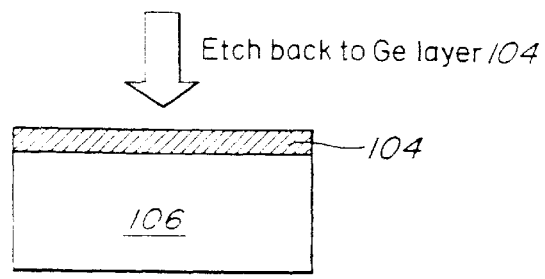
FIG. 1C
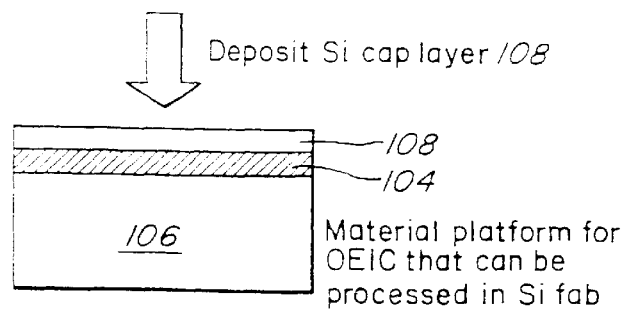
FIG. 1D  Material platform for OEIC that can be processed in Si fab Material platform for OEIC that can be processed in Si fab Bond Etch back to Ge layer 302

Deposit Si cap layer

Material platform for OEIC that can be processed in Si fab

SILICON WAFER WITH EMBEDDED OPTOELECTRONIC MATERIAL FOR MONOLITHIC OEIC

PRIORITY INFORMATION

This application claims priority from provisional application Ser. No. 60/223,407 filed Aug. 4, 2000.

BACKGROUND OF THE INVENTION

The invention relates to an epitaxial structure that contains optoelectronic devices embedded in Si, such that the entire wafer can be processed using traditional Si CMOS tools to create a true monolithic optoelectronic integrated circuit (OEIC).

It has been a long-standing desire of the microelectronics and telecommunications industries to combine optoelectronic components with Si circuitry. Adding optoelectronic functionality to standard Si integrated circuits (ICs) would enable a tremendous range of new applications and devices, such as on-chip optical communication (enabling optical clock timing for high speed processors), inter-chip optical communication links (optical interconnects), and more efficient and compact optical transceivers for data communications and telecommunications.

Although hybrid integration of optical components with Si ICs provides a possible solution, this is not the preferred solution. True monolithic integration of optoelectronics with Si circuitry is far superior to hybrid integration for several reasons. Monolithic integration yields more compact devices (and therefore higher device integration densities); lower packaging costs since wire bonds or flip-chip bonds between the optoelectronic component and Si IC necessary in hybrid integration schemes are eliminated; lower processing costs since the entire device can be processed using standard Si CMOS techniques; and improved device characteristics in applications where hybrid integration yields undesirable electrical parasitics.

It is therefore desirable to create a truly monolithic structure containing both optoelectronic functionality and Si CMOS circuitry. However, an intrinsic problem with integrating optoelectronic functionality into Si chips is that Si itself is not a good optoelectronic material as it neither emits nor detects light efficiently. Therefore, the optically active material integrated with the Si CMOS circuitry must be something other than Si, such as Ge, SiGe, GaAs, InP, AlGaAs, InGaAs, InGaAsP, or any other optically active group IV or III–V semiconductor material. Due to the large lattice mismatch and thermal expansion coefficient mismatch between these materials and Si, monolithically integrated devices created until now have been performance limited by the resulting crystalline defects (specifically threading dislocations) from epitaxy. However, recent progress in defect filtering schemes, such as graded buffer layers or selective epitaxial growth and epitaxial lateral overgrowth, has overcome this problem and enabled the creation of lattice-mismatched epitaxial layers of suitable quality for optoelectronic devices, such as photodetectors, light emitting diodes (LEDs), and lasers.

A major limitation of monolithic optoelectronic integrated circuits created until now has been the requirement that all Si CMOS processing steps be fully completed before integration of the optically active material. This requirement has existed because Si CMOS processing tools cannot be exposed to any other materials due to contamination concerns.

SUMMARY OF THE INVENTION

It is therefore an object of the invention to provide an epitaxial structure in which an optically active semiconductor devices embedded within Si such that the entire wafer can be processed using traditional Si CMOS tools to yield a true monolithic optoelectronic integrated circuit.

The invention provides a structure in which the optically active layer is embedded in a Si wafer, such that the outermost epitaxial layer exposed to the CMOS processing equipment is always Si (or another CMOS-compatible material such as $SiO_2$). Since the optoelectronic layer is completely surrounded by Si, the wafer is fully compatible with standard Si CMOS manufacturing. Therefore, all of the manufacturing and cost benefits associated with Si CMOS processing are fully realized by the invention.

It is important to note that embedding the optoelectronic layer in Si does not prevent transmission of optical signals between the OEIC and an external waveguide (such as an optical fiber) or free space. Specifically, for wavelengths of light longer than the bandgap of Si ($1.1\,\mu m$), Si is completely transparent and therefore optical signals can be transmitted between the embedded optoelectronic layer and an external waveguide using either normal incidence (through the Si substrate or top Si cap layer) or in-plane incidence (edge coupling). This provides tremendous flexibility in designing an OEIC used for the typical telecommunications wavelengths of 1.3 and 1.55 $\mu m$. Additionally, even wavelengths shorter than the bandgap of Si can be coupled in and out of the embedded optoelectronic layer. This is because the top Si cap layer can be made thin enough that it is only minimally absorbing at other commonly used wavelengths, such as 980 or 850 nm. Alternatively, edge coupling could be used for these wavelengths. This flexibility facilitates design of complex system-on-a-chip structures where multiple wavelengths and/or multiple optical in/out connections are required.

BRIEF DESCRIPTION OF THE DRAWINGS

FIGS. 1A–1D are block diagrams of an exemplary embodiment of a graded buffer/wafer bonding process to create an optically-active layer embedded in a Si wafer in accordance with the invention;

DETAILED DESCRIPTION OF THE INVENTION

Figure 2A:
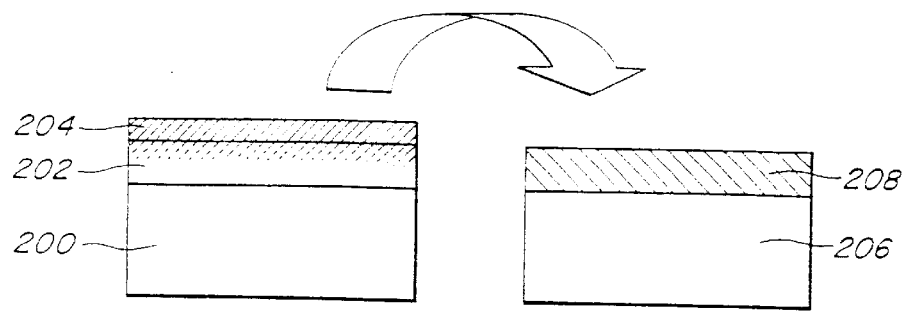
FIGS. 2A–2D are block diagrams of another exemplary embodiment of a graded buffer/wafer bonding process to create a more complex wafer structure that contains an insulating layer between the optically-active layer and the Si substrate.
Figure 2B:
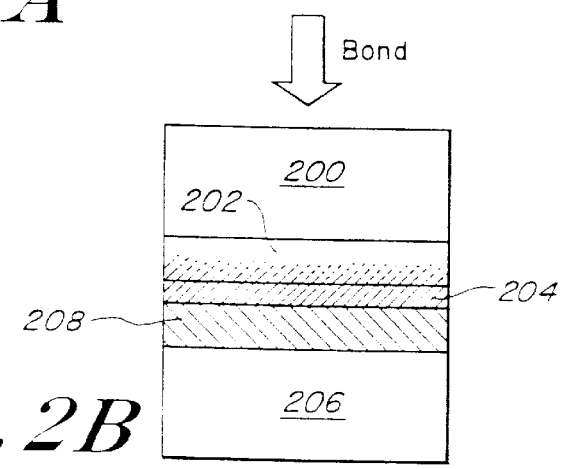
Figure 2C:
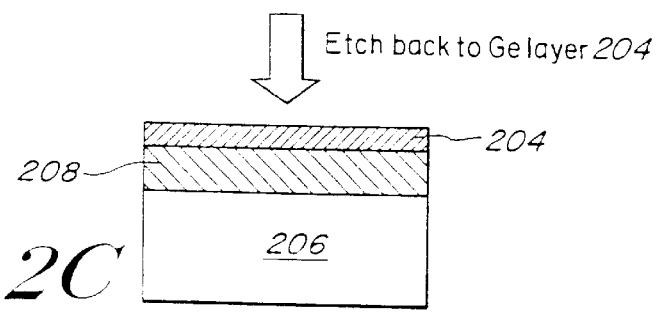
Figure 2D:
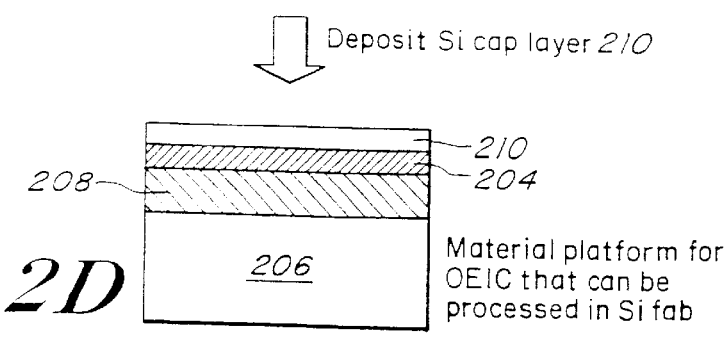

There are several different techniques available to monolithically integrate lattice-mismatched materials, including wafer bonding, graded buffer layers, and epitaxial lateral overgrowth. Wafer bonding is an attractive option because it can directly combine two dissimilar materials together without the need for an "interlayer structure", e.g., a graded buffer layer or selective epitaxial mask. However, even though wafer bonding eliminates the lattice-mismatch problem, two new problems arise which have prevented wafer bonding from reaching its full potential: thermal expansion mismatch and wafer size mismatch.

Thermal expansion mismatch is a serious issue when the dissimilar wafers being bonded are of similar thickness. This mismatch can cause large strains to develop during heating and cooling that can crack the assembly or cause the wafers to debond. Wafer size mismatch relates to the fact that two dissimilar wafers being bonded typically have different diameters. Therefore, some fraction of the larger diameter wafer is wasted. For example, consider bonding a Si substrate and a Ge substrate. Si substrates are commonly available in an eight-inch diameter, while Ge is commonly available only four inches in diameter. Therefore, only a portion of the Si substrate would be covered by the bonding process, while the rest of the wafer would be wasted.

The combination of graded layer growth and wafer bonding removes these two problems and provides tremendous flexibility to create new integrated semiconductor platforms on Si substrates. Consider again the example of bonding Ge to Si, this time using the graded layer/wafer bonding technique illustrated in FIGS. 1A–1D. In this technique, a graded SiGe layer 102 (graded from 0–100% Ge) is epitaxially grown on a Si substrate 100 of any diameter. A Ge layer 104 is then grown on the SiGe graded layer 102. In order to reduce surface roughness, a planarization step such as chemical mechanical polishing can be inserted during growth of the SiGe graded layer 102, as described in U.S. Pat. No. 6,107,653, incorporated herein by reference. Also note that any of the layers described in this invention can receive planarization steps, if desired.

The wafer can then be bonded to another Si substrate 106, of the same diameter as shown in FIGS. 1A and 1B. This technique therefore eliminates the wafer size mismatch issue, and it also eliminates the thermal mismatch issue because both wafers are essentially Si.

Once the wafers are bonded, the original Si substrate 100 can then be ground and selectively etched back. In one embodiment (shown in FIG. 1C), the SiGe graded layer 102 can also be completely removed to leave only the Ge layer 104 on the new host Si substrate 106. A Si cap layer 108 can now be epitaxially grown on top of this structure, such that the optically-active layer 104 (Ge in this case) is effectively embedded in a Si wafer as shown in FIG. 1D.

Although the large lattice mismatch (about 4%) between Ge and Si will create many dislocations during this final Si deposition, they will only reside in the Si cap layer 108, and will not penetrate into the optoelectronic Ge layer 104. This is because for systems with a large lattice mismatch (typically greater than 1.5%) the growth mode is such that dislocations can only achieve short glide distances and therefore will remain in the deposited film. Penetration of misfit dislocations into the underlying film layer (Ge in this case) requires long dislocation glide distances typically only achieved for systems with a lattice mismatch <1.5%. These dislocations in the Si cap layer 108 will not have a deleterious effect on device operation if the CMOS electronics are located in the Si substrate 106 (see FIGS. 6A–6C), rather than in the Si cap layer 108.

In another embodiment, a Si cap layer could be wafer bonded (from another Si substrate) on top of the optically active layer, rather than epitaxially grown. In this embodiment, the Si cap layer would be of high quality, and therefore could be processed into CMOS circuits containing field effect transistors (FETs) or similar devices. In yet another embodiment, the original SiGe graded layer 102 could be only partially removed during etch back, such that a strained Si cap layer could be epitaxially grown on top of the remaining SiGe graded layer 102. This strained Si cap layer would be of high quality, and could be processed into CMOS circuits with enhanced performance compared to relaxed Si CMOS circuits. In still yet another embodiment, the original Si substrate 100 and SiGe graded layer 102 could be completely removed, and a uniform composition SiGe layer could be wafer bonded on top of the optically active layer. A strained Si cap layer could then be epitaxially grown on this SiGe layer and could be processed into CMOS circuits.

It will be appreciated by those skilled in the art that techniques other than grinding/etch back, such as delamination, can be used to remove the Si substrate 100 and graded SiGe layer 102 from the first wafer.

It will also be appreciated by those skilled in the art that additional layers could potentially be incorporated into the structure. For example, in another embodiment as illustrated in FIGS. 2A–2D, a first Si substrate 200 can have a 0–100% graded SiGe layer 202 with a Ge layer 204 on top as before, while a second Si substrate 206 can have a thick insulating layer 208 on its surface, such as $SiO_2$. This insulating layer will serve to isolate the optoelectronic layer 204 from the Si substrate 206 (and any CMOS electronics subsequently processed in said substrate). A (highly defective) Si layer 210 can again be deposited on top of the optoelectronic layer 204.

In yet another embodiment as illustrated in FIGS. 3A–3D, after a graded SiGe 300 and Ge layers 302 are grown on a first Si substrate 304, a Si cap layer 306 can be grown on the Ge layer 302. An optional $SiO_2$ layer can then be grown or deposited on this Si cap layer to aid in wafer bonding. Although this Si cap layer 306 will have a high density of dislocations, they will not deleteriously affect device performance since this Si layer 306 will not be active optically or electronically. One benefit of including this Si cap layer 306 in the heterostructure is to serve as an etch stop when forming the bottom contact to the Ge layer 302. This wafer can then be bonded to another Si substrate 308 which has an insulating layer 310, such as $SiO_2$, on it as before. After etching back to the Ge layer 302, another Si cap layer 312 can be provided.

Figure 4A:
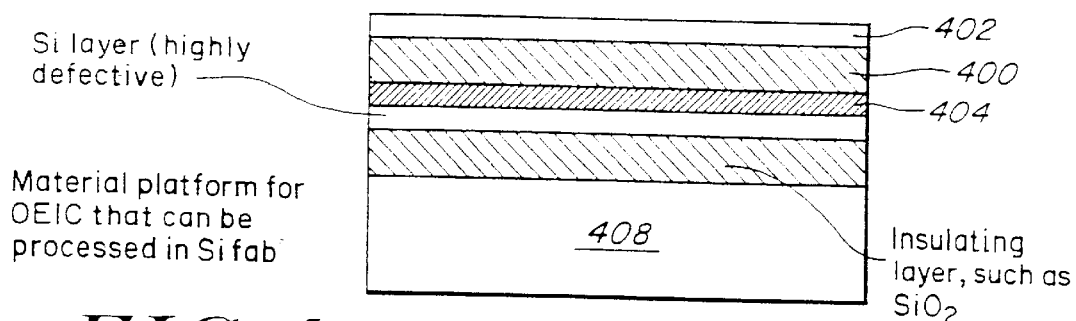
FIGS. 4 are block diagrams showing the resulting wafer structure of still yet another exemplary embodiment of a graded buffer/wafer bonding process, wherein the optically-active layer is isolated from both the Si substrate and the Si cap layer by insulating layers, and showing a possible implementation of the Si CMOS electronics to create a monolithic optoelectronic integrated circuit.
Figure 4B:
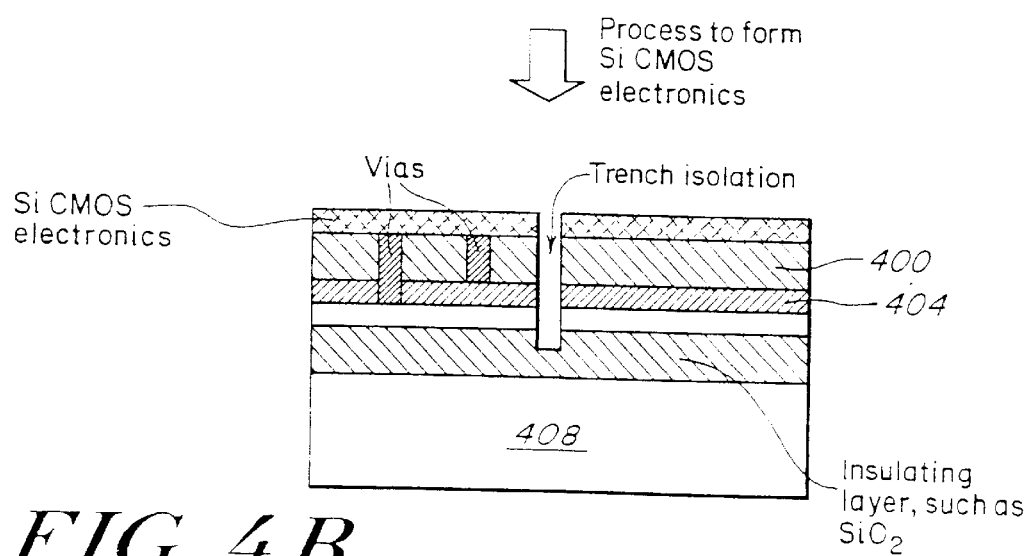

In still yet another embodiment as illustrated in FIGS. 4A–4B, an insulating layer 400 can be inserted between a top Si cap layer 402 and an optically active layer 404. This would be useful to isolate the optically-active layer 404 from the CMOS electronics in a particular OEIC embodiment where the CMOS electronics were located in the top Si cap layer 402, rather than in the Si substrate 408.

Figure 5A:
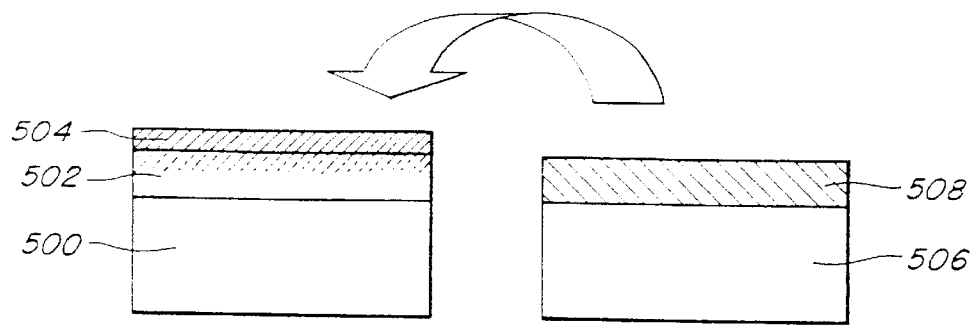
FIGS. 5A–5C are block diagrams of an exemplary embodiment of a graded buffer/wafer bonding process where the original substrate and graded buffer layer are not removed from the structure.
Figure 5B:
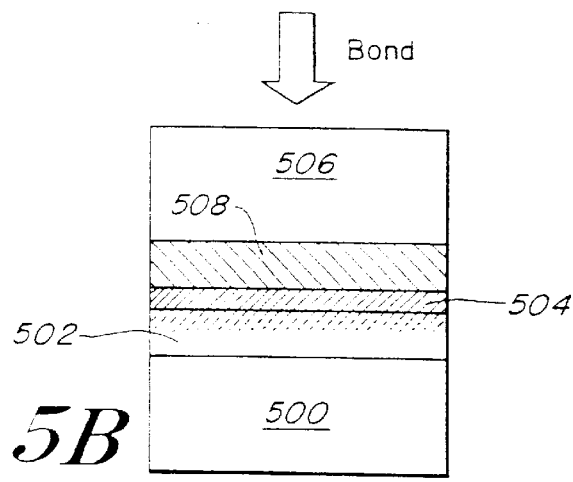
Figure 5C:
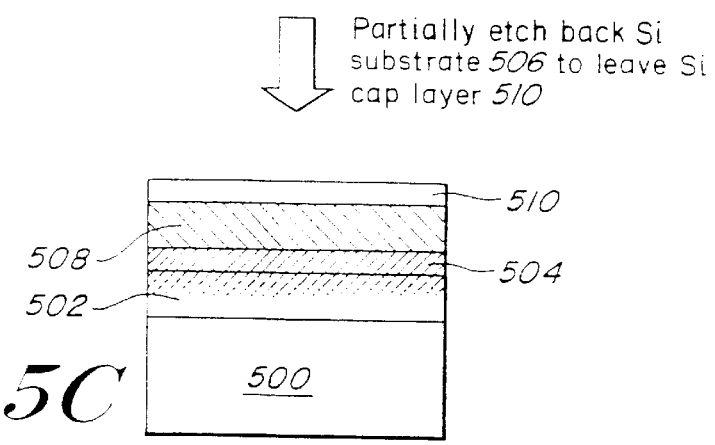

As shown in FIGS. 5A–5C, it is also possible to have an embodiment in which an original Si substrate 500 is not removed. One such structure would involve growing a graded SiGe layer (graded 0–100%) 502, and then a uniform Ge layer 504 as the optically active layer. A second Si substrate 506 with a SiO$_2$ layer 508 can then be wafer bonded on top of the Ge layer 504. The second Si substrate 506 can then be partially etched-back or delaminated to leave a thin Si cap layer 510, which is substantially defect-free. The CMOS electronics would be processed into a top Si cap layer 510 in this embodiment. Additional layers could also be included in this embodiment as discussed above, such as a relaxed SiGe layer with a strained Si cap layer for strained Si CMOS.

It is to be understood that additional layers that serve various purposes could be included in the structure. For example, layers could be included at various heterointerfaces to minimize the (possibly deleterious) effect of energy band discontinuities at these heterointerfaces. As another example, quarter-wavelength-thick layers of materials of alternating high- and low-refractive index could be grown or deposited on top of either wafer before bonding such that a high-reflectance multilayer stack would exist below the optoelectronic material. This stack could serve as the lower mirror of a resonant cavity to enhance optical responsivity at a particular wavelength. During subsequent processing of the bonded wafers, a high-reflectance mirror could be deposited above the optoelectronic layer to complete the resonant cavity, or the uppermost ambient/semiconductor interface could serve as the top mirror.

The structures and techniques described are extendable to other optoelectronic materials besides Ge. For example, simply by grading the SiGe graded layer on the first Si substrate to a certain composition less than 100% Ge, and then growing a uniform layer of SiGe at that composition, a SiGe layer of that composition could be embedded in a Si wafer as the optically-active layer.

As another example, through compositional grading of SiGe and InGaAs layers on Si, it is possible to create a bonded layer of InP or InGaAs on Si as well. This can be accomplished as follows. First, a graded SiGe epitaxial layer (graded from 0–100% Ge) is epitaxially grown on a Si substrate. Since GaAs and Ge have nearly equal lattice constants, a GaAs layer can then be epitaxially grown on top of the Ge layer. At this point, the GaAs layer can be wafer bonded to another Si substrate such that the embedded active optoelectronic layer was GaAs. Alternatively, a relaxed, graded InGaAs layer can be grown on the GaAs layer, graded from 0% In to some desired In concentration, as described in U.S. Pat. No. 6,232,138, incorporated herein by reference. The InGaAs layer can be wafer bonded to another Si substrate.

In yet another embodiment, InGaAsP or InP lattice-matched to In$_{0.53}$Ga$_{0.47}$As can be grown on the structure and wafer bonded to another Si substrate. In yet a more complicated embodiment, lattice-matched heterostructures for various optoelectronic devices can be epitaxially grown on the first wafer, and wafer bonded to the second Si substrate.

As an example, a relaxed SiGe graded layer can be grown from 0–100% Ge on the first Si substrate, on top of which a relaxed, graded InGaAs layer can then be grown from 0–53% In. A lattice-matched InP layer could then be grown, and serve as the starting substrate for any optoelectronic device lattice-matched to InP. For example, a laser structure containing InP, InGaAs, and InGaAsP, all lattice-matched to InP, can then be grown. The entire device structure can be wafer bonded to a second Si substrate, such that the embedded optoelectronic layer in this case was an entire laser (or LED or detector) structure, rather than a single layer as described with Ge. Of course, the structure would have to be grown "upside-down" on the original Si substrate since it would be inverted upon being wafer bonded to the second Si substrate. Similarly, an entire heterostructure lattice-matched to GaAs could be grown on the first Si substrate and then wafer bonded to the second Si substrate.

These other optoelectronic layers can also be coated with Si, such that the embedded optically-active semiconductor material can be chosen from a wide range of materials, including: Ge, SiGe, GaAs, AlGaAs, InGaAs, InP, InGaAsP, any III–V alloy lattice-matched to GaAs, any III–V alloy lattice-matched to InP, any multiple-layer heterostructure (a laser, light emitting diode, or photodetector) lattice-matched to GaAs, or any multiple-layer heterostructure lattice-matched to InP.

Once the planar composite wafer has been fabricated, it contains at a minimum a Si substrate, a layer of optically active material, and a Si cap layer. It may also include optional additional layers or device heterostructures as described. This structure can be processed to create a monolithic optoelectronic integrated circuit. For example, consider the case of creating an optical receiver circuit on Si. The optical receiver could contain a detector and receiver circuit, or multiple detectors and a receiver circuit(s). Since the optically active layer is completely embedded in a Si wafer, this planar composite wafer can be processed as a normal Si wafer would be for CMOS manufacturing.

Figure 3A:
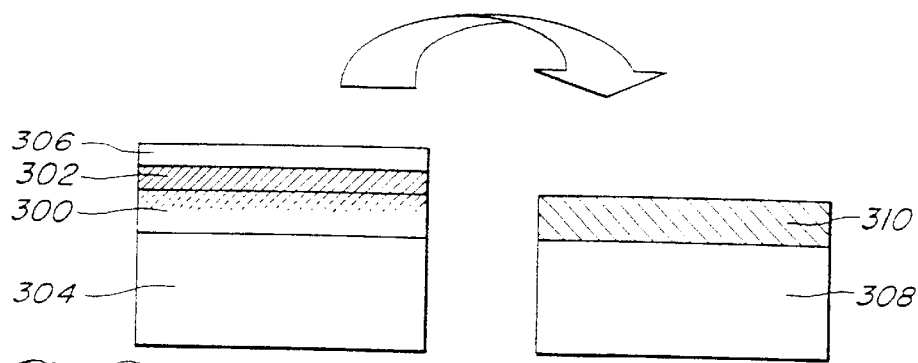
FIGS. 3A–3D are block diagrams of yet another exemplary embodiment of a graded buffer/wafer bonding process to create a yet more complex wafer structure that contains a Si contact layer between the insulating layer and optically-active layer.
Figure 3B:
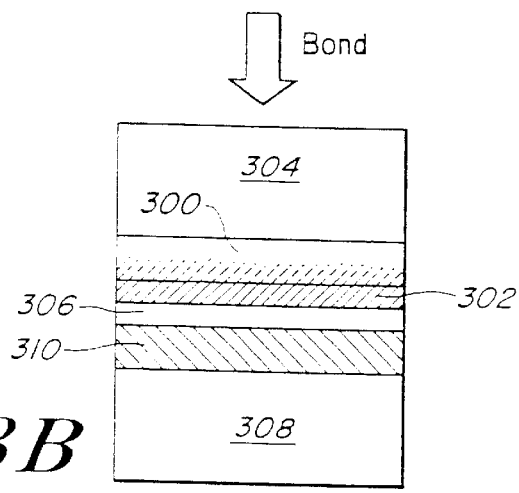
Figure 3C:
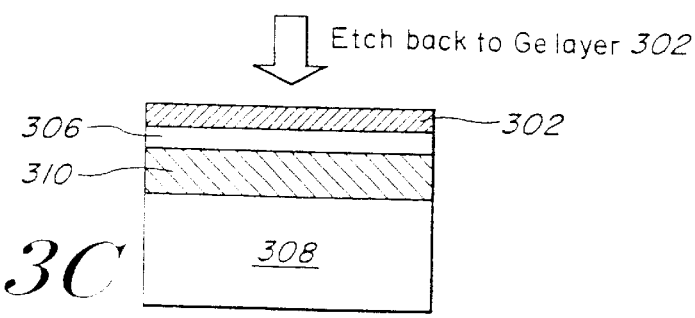
Figure 3D:
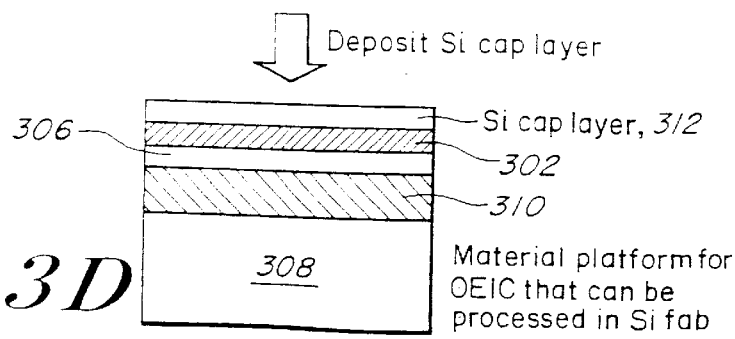
Figure 6A:
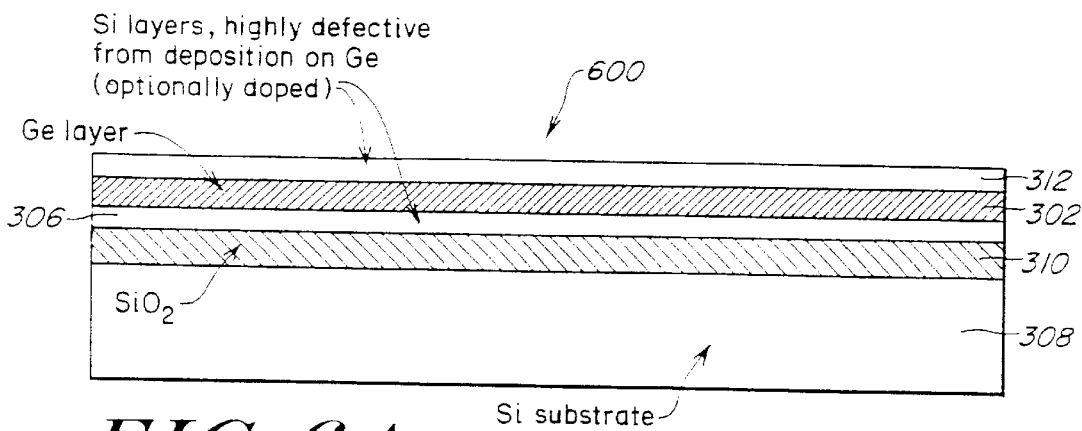
FIGS. 6A–6C are block diagrams showing an exemplary embodiment of an OEIC processing such that the Si CMOS electronics are located in the Si substrate below the optically-active layer.
Figure 6B:
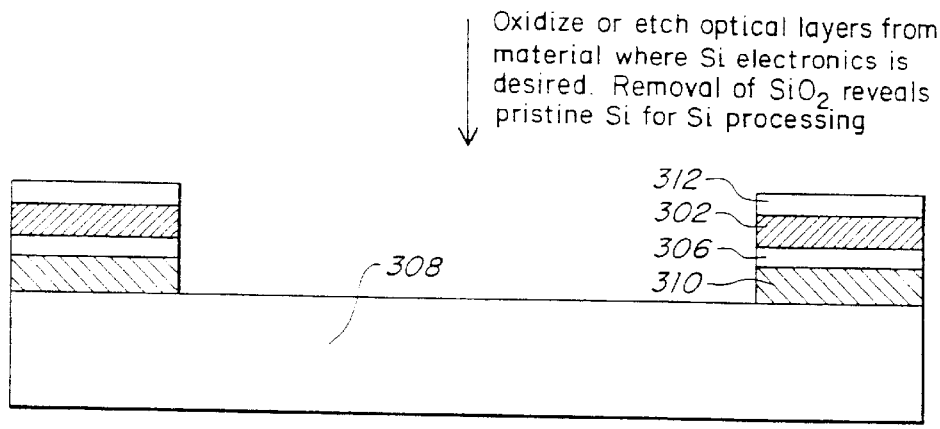
Figure 6C:
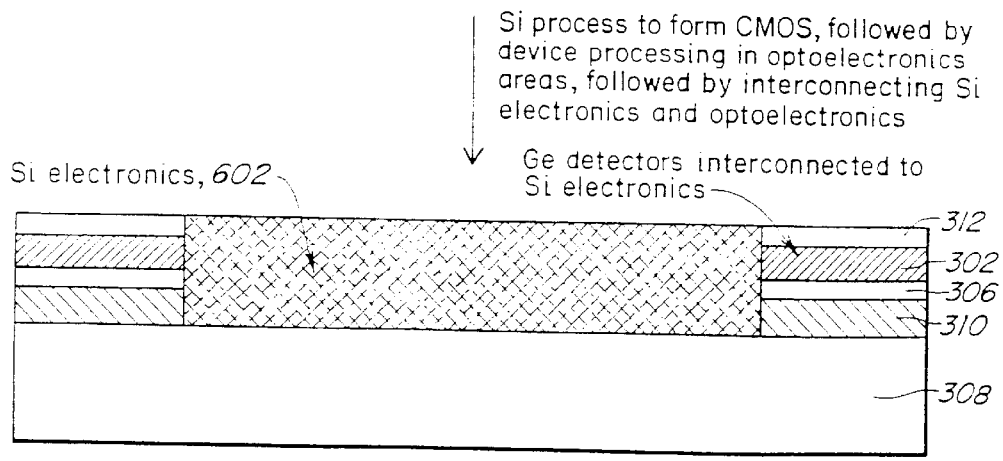

In one embodiment as illustrated in FIGS. 6A–6C, a starting wafer heterostructure 600 based on the resulting structure shown in FIG. 3D, Si CMOS electronics 602 can be processed on the Si substrate. In this embodiment, an early step would include patterning the wafer to define the optoelectronic receiver areas, and these areas would be protected with a mask. The other areas would be etched down to the Si substrate, leaving a virgin Si surface to be processed into CMOS electronics.

It is expected that special attention may be required for the CMOS processing thermal budget to minimize the interdiffusion of (and maintain the integrity of) the embedded optoelectronic layer. However, the thermal budget and controlled interdiffusion could also be used to the device designer's advantage. For example, a slight interdiffusion at the upper and lower surfaces of the optically-active layer (Ge in this example) would grade these interfaces and therefore minimize sharp energy band discontinuities that might be deleterious for certain devices. After CMOS processing is complete, the areas with Ge can then be processed into detectors, and final interconnections can be made between the Si CMOS circuit and the Ge detectors.

Alternatively, the Si CMOS electronics can also be fabricated above the optoelectronic layer, rather than co-planar with it. Rather than epitaxially growing a highly-defective Si cap layer above the optoelectronic (Ge in this example) layer, a high-quality Si cap layer can be wafer bonded above the optoelectronic layer as described. The Si CMOS electronics can be formed in this Si cap layer above the optoelectronic layer, rather than in the Si substrate. Vias can be drilled through this top Si CMOS layer to provide contacts to the underlying optoelectronic layer where desired. Underlying Si layers could serve as etch stops, as mentioned above. Individual components can be isolated from one another using trench isolation.

In yet another embodiment, the CMOS circuits can be fabricated in a strained Si cap layer above the optoelectronic layer as described, rather than in a relaxed Si cap layer. This can be achieved by wafer bonding (or epitaxially growing)

a relaxed SiGe layer of a desired composition on top of the optoelectronic (Ge) layer. A strained Si cap layer can then be epitaxially grown on top of the relaxed SiGe layer. Again, vias can be drilled through the strained Si and relaxed SiGe layers to contact the optoelectronic layer where desired.

The optoelectronic layer being embedded in Si has several advantages. First, the entire integration sequence can occur within a Si foundry. Even the interconnects between the Si CMOS and optoelectronic layer can be performed with Si contact technology, since the contact which will be formed in the optoelectronic region will be a contact to the Si cap layer on the optoelectronic layer. All contact and interconnect materials could be based on standard Si VLSI processing. For example, contacts could be made using Ni, Co, or Ti, and the resulting silicides. Via plugs can use tungsten, while metal interconnect lines can use Al or Cu. Also, the large defect density in the Si contact layers (present in certain embodiments) will aid in creating low resistance contacts, since these defects will enhance interdiffusion and diffusion.

Alternatively, since the Si layers are deposited epitaxially in some embodiments, the doping can be controlled with epitaxy and high thermal budgets for activating implants are not needed in these embodiments. Additionally, Ge-based optically active regions do not necessarily need to be doped during the epitaxial process. Since Ge is isoelectronic with Si, the same elements that dope Si will dope Ge. Thus, given the current process simulation tools, one can simply dope the Si contact layers (in certain embodiments where the Ge layer directly contacts a Si layer at its upper and lower surfaces, i.e. FIG. 3D) and leave the Ge intrinsic; during subsequent processing, the dopants can enter the Ge, creating the p-i-n structure in Ge needed for photodiode behavior. Also, in situ deposition of a Si layer on top of the Ge will help prevent the surface nucleation of cracks in the Ge due to the thermal expansion difference between Si and Ge.

Finally, it is important to note that since Si has a larger bandgap than the optical wavelengths of light typically used in telecommunications (1.3 and 1.55 µm), the Si substrate and top cap layer are both transparent to these wavelengths. Thus, transmission of optical signals between the embedded optoelectronic layer and an external waveguide (such as an optical fiber or free space) can easily occur by either normal incidence through the front or backside of the wafer, or in-plane incidence. Additionally, even wavelengths shorter than the bandgap of Si can be coupled in and out of the embedded optoelectronic layer. This is because the top Si cap layer can be made thin enough that it is only minimally absorbing at other commonly used wavelengths, such as 980 or 850 nm. Alternatively, edge coupling could be used for these wavelengths.

Figure 7:
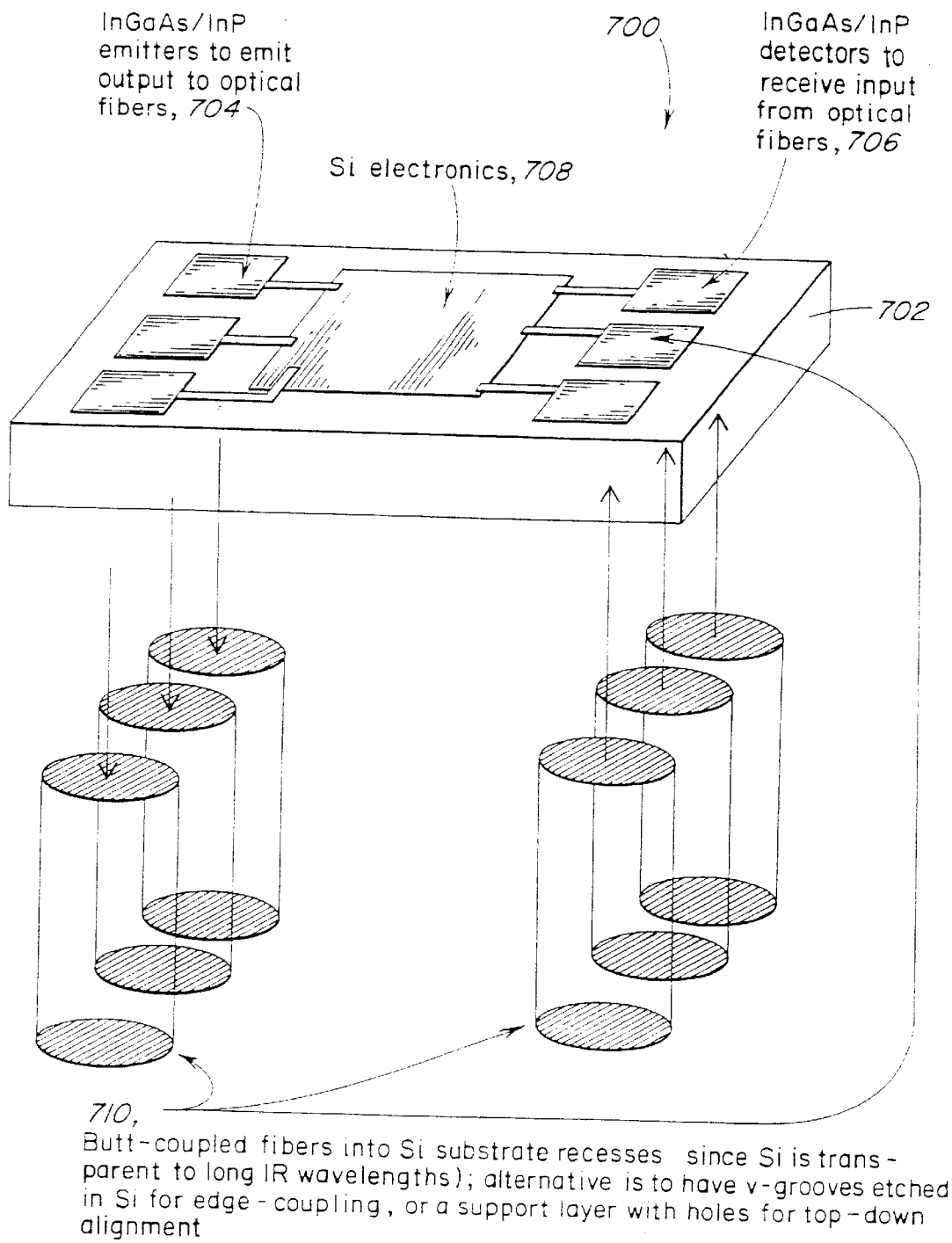
FIGS. 7 is a block diagram of an exemplary embodiment of an OEIC implementation in which emitters, detectors, and Si CMOS electronics have all been monolithically integrated on the same Si substrate.

Thus, the embedded optically-active layers can be used for the creation of complex integrated optoelectronic transceivers. One can therefore construct, for example, optical network switches on a chip. A schematic example of such an OEIC 700 is shown in FIG. 7. In this example, an InGaAs/InP heterostructure has been embedded in a Si wafer 702. Certain regions have been processed to form emitters 704 using this embedded optically-active material, while other regions have been processed to form detectors 706. The diagram has been drawn simplistically for clarity, as the InGaAs/InP emitters and detectors are not actually exposed on the surface of the wafer. They are embedded in the wafer 702. The top layer of the entire structure is Si.

A simple structure that would enable the formation of both emitters and detectors is a p-i-n structure, which would emit light when forward-biased, and detect light when reverse-biased. In another region of the wafer, Si electronics 708 have been processed into the Si substrate. The Si electronics are connected to the optoelectronic devices using interconnects based on standard Si interconnect materials, such as Al or Cu. Additionally, since the entire top surface of the wafer is a Si cap layer, the contacts to the optoelectronic emitters and detectors can be made using standard Si contact materials, such as Ni, Co, or Ti silicides. Finally, optical signals can be transmitted between the OEIC and external optical fibers. One possibility is shown in the figure, where the light is transmitted through the substrate to butt-coupled fibers 710. The optical signals could also be transmitted through the Si cap layer, such that optical fibers would be positioned above the OEIC. A third possibility is to use edge coupling, where v-grooves would be etched in the substrate to align optical fibers for in-plane incidence.

Although the present invention has been shown and described with respect to several preferred embodiments thereof, various changes, omissions and additions to the form and detail thereof, may be made therein, without departing from the spirit and scope of the invention.

What is claimed is:

1. An semiconductor heterostructure comprising:
   a Si substrate;
   an optically active semiconductor device on said substrate, said optically active semiconductor device comprising at least one layer lattice-mismatched with respect to said substrate and substantially relaxed; and
   a cap layer on said optically active semiconductor device, said cap layer comprising Si.

2. The semiconductor heterostructure of claim 1, wherein said optically active semiconductor device comprises a laser or light emitting diode.

3. The semiconductor heterostructure of claim 1, wherein said optically active semiconductor device comprises a photodetector.

4. The semiconductor heterostructure of claim 1, wherein said optically active semiconductor device comprises an optical modulator.

5. The semiconductor heterostructure of claim 1, wherein said optically active semiconductor device comprises at least one material from the group of: Ge, GaAs, InP, AlGaAs, InGaAs, InGaAsN, InGaAsP, a III–V alloy lattice-matched to GaAs, or a III–V alloy lattice-matched to InP.

6. The semiconductor heterostructure of claim 1, wherein said optically active semiconductor device comprises SiGe.

7. The semiconductor heterostructure of claim 1, wherein said optically active semiconductor device comprises a multiple layer heterostructure lattice-matched to GaAs, or a multiple layer heterostructure lattice-matched to InP.

8. The semiconductor heterostructure of claim 1, wherein said optically active semiconductor device operates at a wavelength for which Si is transparent.

9. The semiconductor heterostructure of claim 1 further comprising a relaxed, graded $Si_{1-x}Ge_x$ layer graded from x=0 to x≦1, positioned between said Si substrate and said optically-active semiconductor device.

10. The semiconductor heterostructure of claim 9 further comprising a relaxed, graded $In_xGa_{1-x}$ layer graded from x=0 to x≦1, positioned between said relaxed, graded $Si_{1-x}Ge_x$ layer and said optically active semiconductor device.

11. The semiconductor heterostructure of claim 1, wherein at least one layer has been planarized.

12. An semiconductor heterostructure comprising:
a Si substrate;
an insulating layer on said substrate;
an optically active semiconductor device on said insulating layer, said optically active semiconductor device comprising at least one layer lattice-mismatched with respect to said substrate and being substantially relaxed; and
a cap layer on said optically active semiconductor device, said cap layer comprising Si.

13. The semiconductor heterostructure of claim 12, wherein said optically active semiconductor device comprises a laser or light emitting diode.

14. The semiconductor heterostructure of claim 12, wherein said optically active semiconductor device comprises a photodetector.

15. The semiconductor heterostructure of claim 12, wherein said optically active semiconductor device comprises an optical modulator.

16. The semiconductor heterostructure of claim 12, wherein said optically active semiconductor device comprises at least one material from the group of: Ge, GaAs, InP, AlGaAs, InGaAs, InGaAsN, InGaAsP, a III–V alloy lattice-matched to GaAs, or a III–V alloy lattice-matched to InP.

17. The semiconductor heterostructure of claim 12, wherein said optically active semiconductor device comprises SiGe.

18. The semiconductor heterostructure of claim 12, wherein said optically active semiconductor device comprises a multiple layer heterostructure lattice-matched to GaAs, or a multiple layer heterostructure lattice-matched to InP.

19. The semiconductor heterostructure of claim 12, wherein said optically active semiconductor device operates at a wavelength for which Si is transparent.

20. The semiconductor heterostructure of claim 12, wherein said insulating layer comprises $SiO_2$.

21. The semiconductor heterostructure of claim 12, wherein at least one layer has been planarized.

22. An semiconductor heterostructure comprising:
a Si substrate;
an optically-active semiconductor device on said substrate, said optically active semiconductor device comprising at least one layer lattice-mismatched with respect to said substrate and being substantially relaxed;
an insulating layer on said optically active semiconductor device; and
a cap layer on said insulating layer, said cap layer comprising Si.

23. The semiconductor heterostructure of claim 22, wherein said optically active semiconductor device comprises a laser or light emitting diode.

24. The semiconductor heterostructure of claim 22, wherein said optically active semiconductor device comprises a photodetector.

25. The semiconductor heterostructure of claim 22, wherein said optically active semiconductor device comprises an optical modulator.

26. The semiconductor heterostructure of claim 22, wherein said optically active semiconductor device comprises at least one material from the group of: Ge, GaAs, InP, AlGaAs, InGaAs, InGaAsN, InGaAsP, a III–V alloy lattice-matched to GaAs, or a III–V alloy lattice-matched to InP.

27. The semiconductor heterostructure of claim 22, wherein said optically active semiconductor device comprises SiGe.

28. The semiconductor heterostructure of claim 22, wherein said optically active semiconductor device comprises a multiple layer heterostructure lattice-matched to GaAs, or a multiple layer heterostructure lattice-matched to InP.

29. The semiconductor heterostructure of claim 22, wherein said optically active semiconductor device operates at a wavelength for which Si is transparent.

30. The semiconductor heterostructure of claim 22, wherein said insulating layer comprises $SiO_2$.

31. The semiconductor heterostructure of claim 22 further comprising a relaxed, graded $Si_{1-x}Ge_x$ layer graded from x=0 to x≦1, positioned between said Si substrate and said optically active semiconductor device.

32. The semiconductor heterostructure of claim 31 further comprising a relaxed, graded $In_xGa_{1-x}As$ layer graded from x=0 to x≦=1, positioned between said relaxed, graded $Si_{1-x}Ge_x$ layer and said optically-active semiconductor device.

33. The semiconductor heterostructure of claim 22, wherein at least one layer has been planarized.

34. An semiconductor heterostructure comprising:
a Si substrate;
a first insulating layer on said substrate;
an optically-active semiconductor device on said first insulating layer, said optically active semiconductor device comprising at least one layer lattice-mismatched with respect to said substrate and being substantially relaxed;
a second insulating layer on said optically active semiconductor device;
a cap layer on said second insulating layer, said cap layer comprising Si.

35. The semiconductor heterostructure of claim 34, wherein said optically active semiconductor device comprises a laser or light emitting diode.

36. The semiconductor heterostructure of claim 34, wherein said optically active semiconductor device comprises a photodetector.

37. The semiconductor heterostructure of claim 34, wherein said optically active semiconductor device comprises an optical modulator.

38. The semiconductor heterostructure of claim 34, wherein said optically active semiconductor device comprises at least one material from the group of: Ge, GaAs, InP, AlGaAs, InGaAs, InGaAsN, InGaAsP, a III–V alloy lattice-matched to GaAs, or a III–V alloy lattice-matched to InP.

39. The semiconductor heterostructure of claim 34, wherein said optically active semiconductor device comprises SiGe.

40. The semiconductor heterostructure of claim 34, wherein said optically active semiconductor device comprises a multiple layer heterostructure lattice-matched to GaAs, or a multiple layer heterostructure lattice-matched to InP.

41. The semiconductor heterostructure of claim 34, wherein said optically active semiconductor device operates at a wavelength for which Si is transparent.

42. The semiconductor heterostructure of claim 34, wherein said insulating layers comprise $SiO_2$.

43. The semiconductor heterostructure of claim 34, wherein at least one layer has been planarized.

44. An semiconductor heterostructure comprising:
a Si substrate;
a first insulating layer on said substrate;
a first Si contact layer on said first insulating layer;

an optically-active semiconductor device on said first Si contact layer, said optically active semiconductor device comprising at least one layer lattice-mismatched with respect to said substrate and being substantially relaxed;

a second Si contact layer on said optically active semiconductor device;

a second insulating layer on said second Si contact layer;

a cap layer on said second insulating layer, said cap layer comprising Si.

45. The semiconductor heterostructure of claim 44, wherein said optically active semiconductor device comprises a laser or light emitting diode.

46. The semiconductor heterostructure of claim 44, wherein said optically active semiconductor device comprises a photodetector.

47. The semiconductor heterostructure of claim 44, wherein said optically active semiconductor device comprises an optical modulator.

48. The semiconductor heterostructure of claim 44, wherein said optically active semiconductor device comprises at least one material from the group of: Ge, GaAs, InP, AlGaAs, InGaAs, InGaAsN, InGaAsP, a III–V alloy lattice-matched to GaAs, or a III–V alloy lattice-matched to InP.

49. The semiconductor heterostructure of claim 44, where said optically active semiconductor device comprises SiGe.

50. The semiconductor heterostructure of claim 44, wherein said optically active semiconductor device comprises a multiple layer heterostructure lattice-matched to GaAs, or a multiple layer heterostructure lattice-matched to InP.

51. The semiconductor heterostructure of claim 44, wherein said optically active semiconductor device operates at a wavelength for which Si is transparent.

52. The semiconductor heterostructure of claim 44, wherein said insulating layers comprise $SiO_2$.

53. The semiconductor heterostructure of claim 44, wherein at least one layer has been planarized.

54. The semiconductor heterostructure of claim 1, wherein said cap layer comprises a relaxed SiGe layer with a strained Si layer on top.

55. The semiconductor heterostructure of claim 12, wherein said cap layer comprises a relaxed SiGe layer with a strained Si layer on top.

56. The semiconductor heterostructure of claim 22, wherein said cap layer comprises a relaxed SiGe layer with a strained Si layer on top.

57. The semiconductor heterostructure of claim 34, wherein said cap layer comprises a relaxed SiGe layer with a strained Si layer on top.

58. The semiconductor heterostructure of claim 44, wherein said cap layer comprises a relaxed SiGe layer with a strained Si layer on top.

* * * * *

UNITED STATES PATENT AND TRADEMARK OFFICE
CERTIFICATE OF CORRECTION

PATENT NO. : 6,677,655 B2
DATED : January 13, 2004
INVENTOR(S) : Fitzgerald

It is certified that error appears in the above-identified patent and that said Letters Patent is hereby corrected as shown below:

<u>Title page,</u>
Item [75], please replace the word "Fitzergald" with the inventor's name
-- Fitzgerald --

Signed and Sealed this

Twenty-ninth Day of June, 2004

JON W. DUDAS
*Acting Director of the United States Patent and Trademark Office*